(12) United States Patent
Moriya (10) Patent No.: US 9,112,478 B2
(45) Date of Patent: Aug. 18, 2015

(54) DUPLEXER

(71) Applicant: TAIYO YUDEN CO., LTD., Tokyo (JP)

(72) Inventor: Akira Moriya, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 161 days.

(21) Appl. No.: 13/924,118

(22) Filed: Jun. 21, 2013

(65) Prior Publication Data

US 2014/0009247 A1    Jan. 9, 2014

(30) Foreign Application Priority Data

Jul. 3, 2012   (JP) ................................. 2012-149728

(51) Int. Cl.
*H03H 9/54*   (2006.01)
*H03H 9/72*   (2006.01)

(52) U.S. Cl.
CPC ...................................... *H03H 9/725* (2013.01)

(58) Field of Classification Search
CPC .............................. H03H 9/706; H03H 9/725
USPC .................................. 333/133, 193, 191, 189
See application file for complete search history.

(56) References Cited

U.S. PATENT DOCUMENTS

| | | | |
|---|---|---|---|
| 6,262,637 B1* | 7/2001 | Bradley et al. | 333/133 |
| 6,924,715 B2* | 8/2005 | Beaudin et al. | 333/133 |
| 8,279,021 B2* | 10/2012 | Hara et al. | 333/133 |
| 2011/0316647 A1 | 12/2011 | Ouchi et al. | |
| 2013/0147678 A1* | 6/2013 | Taniguchi | 343/853 |

FOREIGN PATENT DOCUMENTS

| | | |
|---|---|---|
| JP | 2010-21914 A | 1/2010 |
| JP | 4799596 B2 | 10/2011 |
| JP | 2012-10164 A | 1/2012 |

* cited by examiner

*Primary Examiner* — Dinh Le
(74) *Attorney, Agent, or Firm* — Chen Yoshimura LLP (57) ABSTRACT

A duplexer includes: a transmission filter connected between a common terminal and a transmission terminal; and a reception filter connected between the common terminal and a reception terminal, wherein the reception filter includes resonators located on a piezoelectric substrate, at least one resonator of the resonators is grounded, and a resonator located at a side closest to the common terminal out of the grounded resonator is a divided resonator that is divided into two or more, and a resonance frequency fr of the divided resonator is in a range of $fr=2\times(f_{TL}$ to $f_{TH})-(f_{RL}$ to $f_{RH})$ when a pass frequency of the transmission filter is $f_{TL}$ to $f_{TH}$ and a pass frequency of the reception filter is $f_{RL}$ to $f_{RH}$.

7 Claims, 14 Drawing Sheets

RECEPTION FILTER

FREQUENCY
f1 : FREQUENCY OF INTERFERING WAVE SIGNAL
f2 : FREQUENCY OF TRANSMISSION SIGNAL
IM3 : FREQUENCY AT WHICH THIRD-ORDER INTERMODULATION
   DISTORTION OCCURS (RECEPTION FREQUENCY)

FIG. 2B

FREQUENCY
f1 : FREQUENCY OF INTERFERING WAVE SIGNAL(LTE Band13 Tx)
f2 : FREQUENCY OF TRANSMISSION SIGNAL(Band5 Tx)
IM3 : FREQUENCY AT WHICH THIRD-ORDER INTERMODULATION
   DISTORTION OCCURS (Band5 RECEPTION FREQUENCY)

DUPLEXER

CROSS-REFERENCE TO RELATED APPLICATION

This application is based upon and claims the benefit of priority of the prior Japanese Patent Application No. 2012-149728, filed on Jul. 3, 2012, the entire contents of which are incorporated herein by reference.

FIELD

A certain aspect of the present invention relates to a duplexer.

BACKGROUND

Duplexers using acoustic wave elements are small in size and have high steepness, and thus have been widely used in wireless terminals such as mobile phones. The wireless terminal receives interfering wave signals with frequencies different from the frequency of a reception signal in addition to the reception signal. There has been known that non-linear effect of a resonator including an acoustic wave element causes intermodulation distortion (IMD: Intermoduration Distortion), and degrades receiving sensitivity. There has been known a circuit configuration dividing a series resonator in a duplexer and connecting them to reduce the above described non-linear characteristics, for example (e.g. Japanese Patent Application Publication No. 2010-21914).

When a series resonator is divided and connected in a duplexer, a layout area of the resonator becomes large, and may prevent downsizing.

SUMMARY OF THE INVENTION

According to an aspect of the present invention, there is provided a duplexer including: a transmission filter connected between a common terminal and a transmission terminal; and a reception filter connected between the common terminal and a reception terminal, wherein the reception filter includes resonators located on a piezoelectric substrate, at least one resonator of the resonators is grounded, and a resonator located at a side closest to the common terminal out of the grounded resonator is a divided resonator that is divided into two or more, and a resonance frequency fr of the divided resonator is in a range of fr=2×($f_{TL}$ to $_{TH}$)−($f_{RL}$ to $f_{RH}$) when a pass band of the transmission filter is $f_{TL}$ to $f_{TH}$ and a pass band of the reception filter is $f_{RL}$ to $f_{RH}$.

DETAILED DESCRIPTION

First Embodiment

Figure 1:
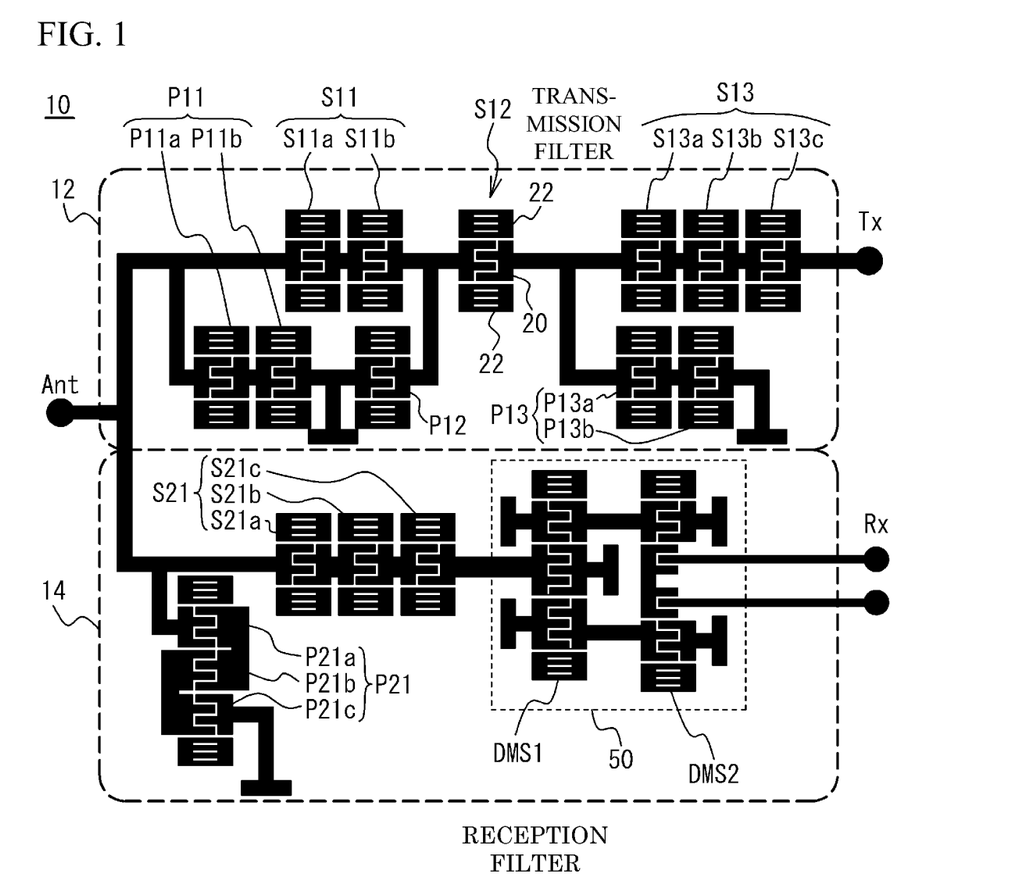
FIG. 1 is a diagram illustrating a configuration of a duplexer in accordance with a first embodiment.

FIG. 1 is a diagram illustrating a configuration of a duplexer 10 in accordance with a first embodiment. As illustrated in FIG. 1, a transmission filter 12 is connected between an antenna terminal Ant and a transmission terminal Tx, and a reception filter 14 is connected between the antenna terminal Ant and a reception terminal Rx. The transmission filter 12 and the reception filter 14 share the antenna terminal Ant that is a common terminal.

The transmission filter 12 includes series resonators S11 through S13 connected in series between the antenna terminal Ant and the transmission terminal Tx, and parallel resonators P11 through P13 connected between respective series resonators S11 through S13 and a ground. The series resonators S11 through S13 and the parallel resonators P11 through P13 are formed by a surface acoustic wave (SAW) resonator formed on a piezoelectric substrate, and each includes a pair of IDTs (Interdigital Transducer) 20 facing each other and two reflection electrodes 22 located at both ends of it. FIG. 1 affixes reference numerals of the IDT and the like to only the series resonator S12, and omits reference numerals in other resonators.

The series resonator S11 is formed by resonators S11a and S11b connected in series. The two series resonators (S11a, S11b) are formed by serially dividing one series resonator S11. Hereinafter, the resonator divided in the above described manner is described as a "divided resonator". The series resonator S13 is also formed by three resonators (S13a, S13b, S13c) that are serially divided as with the series resonator S11. The parallel resonators P11 and P13 are also the divided resonators serially divided (P11a, P11b, P13a, P13b). A first end of the parallel resonator P13 is independently connected to a ground, and first ends of the parallel resonators P11 and P12 are unified and then connected to a ground.

The reception filter 14 includes a series resonator S21 and a DMS unit 50 connected in series between the antenna terminal Ant and the reception terminal Rx. The series resonator S21 is the divided resonator serially divided into three (S21a, S22b, S22c). The DMS unit 50 includes a DMS1 and a DMS2 that are single-input double-output double mode SAW (DMS) filters. In addition, the reception filter 14 includes a parallel resonator P21 connected between the antenna terminal Ant and a ground. The parallel resonator P21 is the divided resonator serially divided into three (P21a, P22b, P22c).

As with the transmission filter 12, the series resonator S21, the parallel resonator P21, and the DMS unit 50 are formed by a SAW resonator formed on the piezoelectric substrate, and each includes a pair of IDTs facing each other and two reflection electrodes located at both ends of it. The resonators P21a through P21c formed by division are divided in the propagation direction of a surface acoustic wave.

Figure 2A:
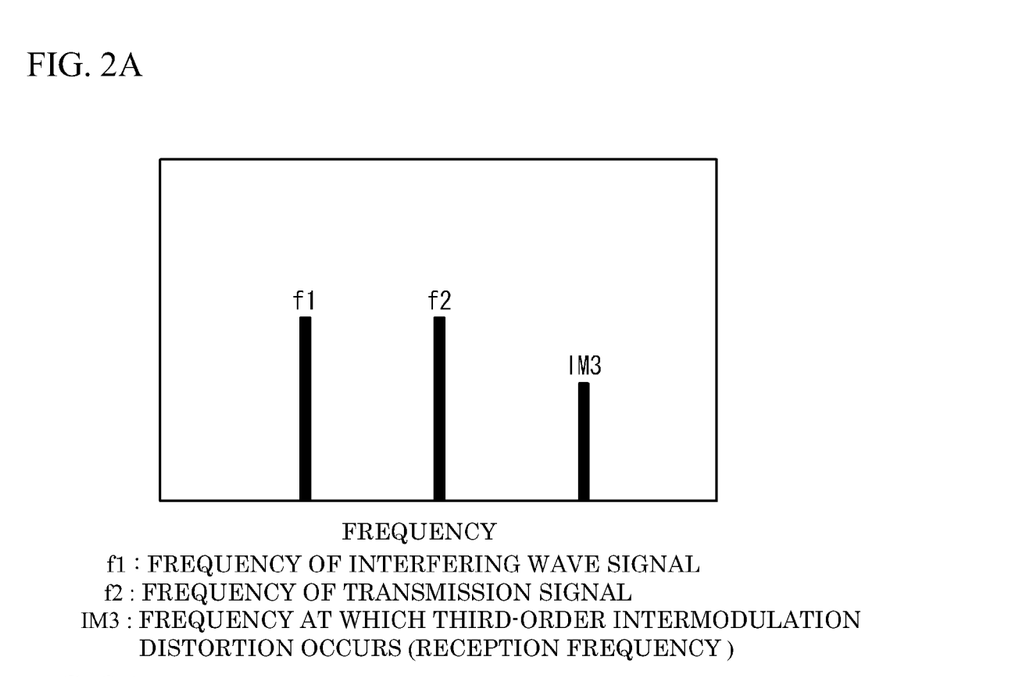
FIG. 2A and FIG. 2B are graphs illustrating a relationship between a reception signal and an interfering wave.

FIG. 2A is a graph illustrating a relationship between a reception signal and an interfering wave. In the drawing, f1 represents the frequency of an interfering wave input to the reception filter 14 through the antenna terminal Ant, f2 represents the frequency of a transmission signal input from the transmission filter 12 to the reception filter 14, and IM3 represents a frequency at which third-order intermodulation distortion occurs. The resonance frequency fr of the parallel resonator P21 is preferably configured so as to be fr=2×($f_{TL}$ to $f_{TH}$)−($f_{RL}$ to $f_{RH}$) when the pass band of the transmission filter is $f_{TL}$ to $f_{TH}$, and the pass band of the reception filter is $f_{RL}$ to $f_{RH}$. For example, in a case of band 5 (transmission Tx band: 824 to 949 MHz, reception Rx band: 869 to 894 MHz), the resonance frequency fr of the parallel resonator P21 is preferably set to fr=2×(824 to 849)−(869 to 894)=779 to 804 MHz.

Figure 2B:
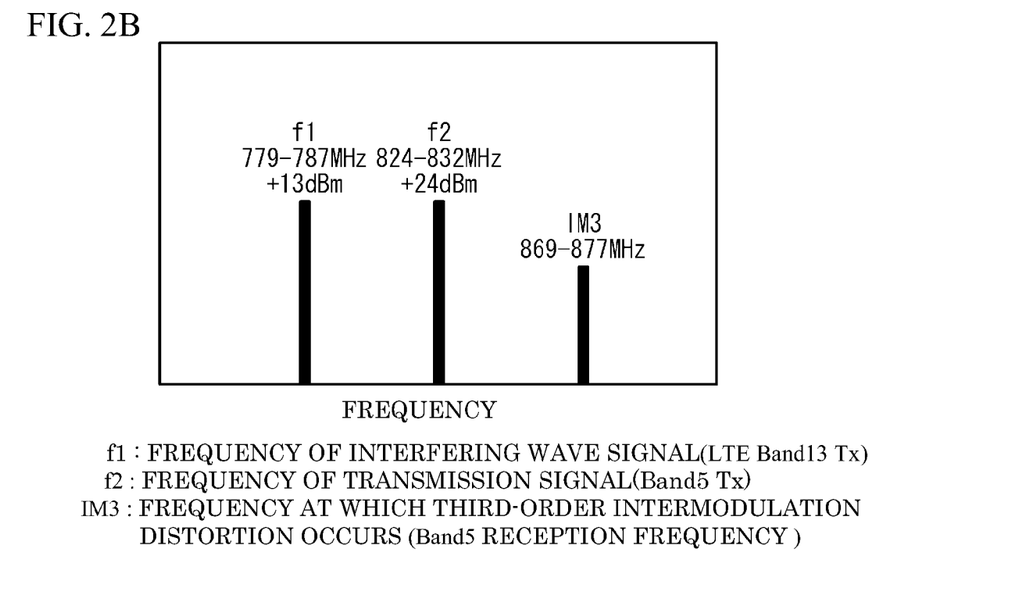

FIG. 2B is a graph illustrating a tangible example of the interference frequency. For example, in a duplexer for Band5, the reception band of Band5 overlaps the frequency of the intermodulation signal formed by a transmission signal of Band13 (transmission Tx band: 777 to 787 MHz, reception Rx band: 746 to 756 MHz) and a transmission signal of Band5. At this time, the resonance frequency of the parallel resonator P21, which is the divided resonator, is preferably set to a part of the transmission band of Band13 (779 to 804 MHz). This enables to reduce intermodulation distortion.

Figure 3:
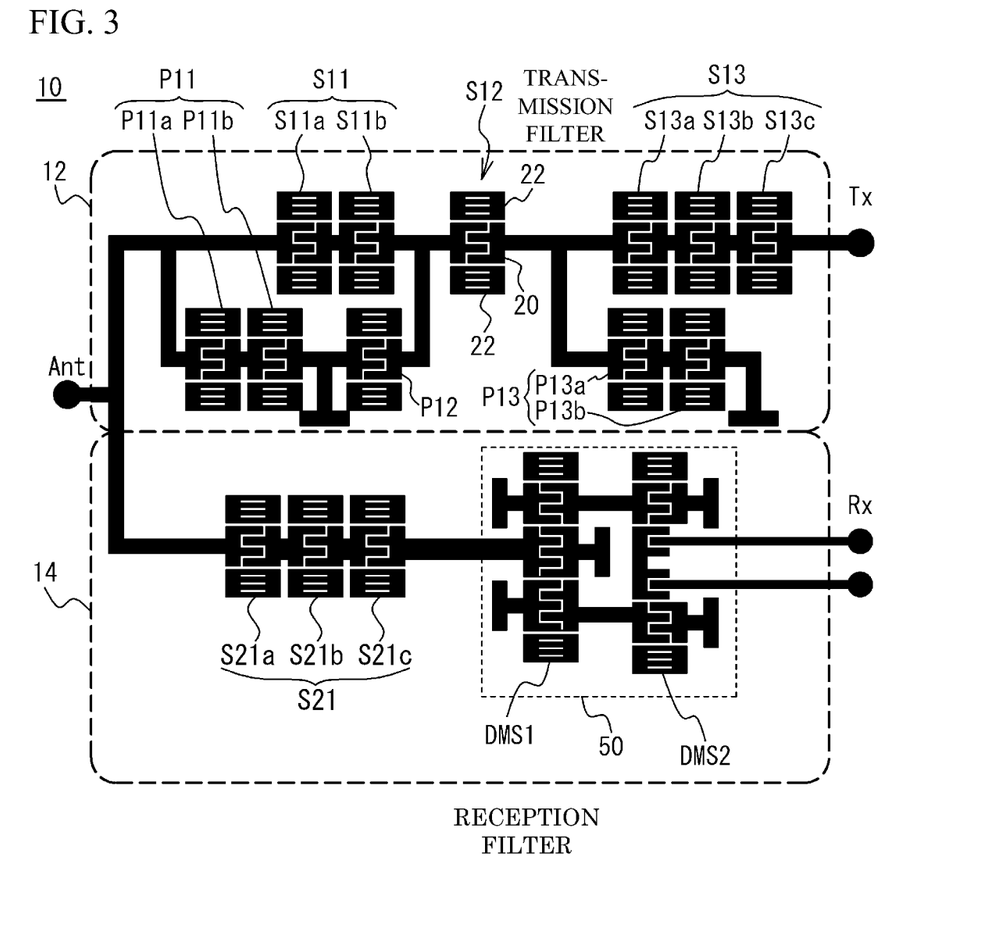
FIG. 3 is a diagram illustrating a configuration of a duplexer in accordance with a comparative example.

FIG. 3 is a diagram illustrating a configuration of a duplexer in accordance with a comparative example. Unlike the first embodiment (FIG. 1), the parallel resonator P21 is not located at the reception filter 14 side, but other configuration is the same as the one illustrated in FIG. 1. The following describes a comparison between the first embodiment (FIG. 1) and the comparative example (FIG. 3).

Figure 4:
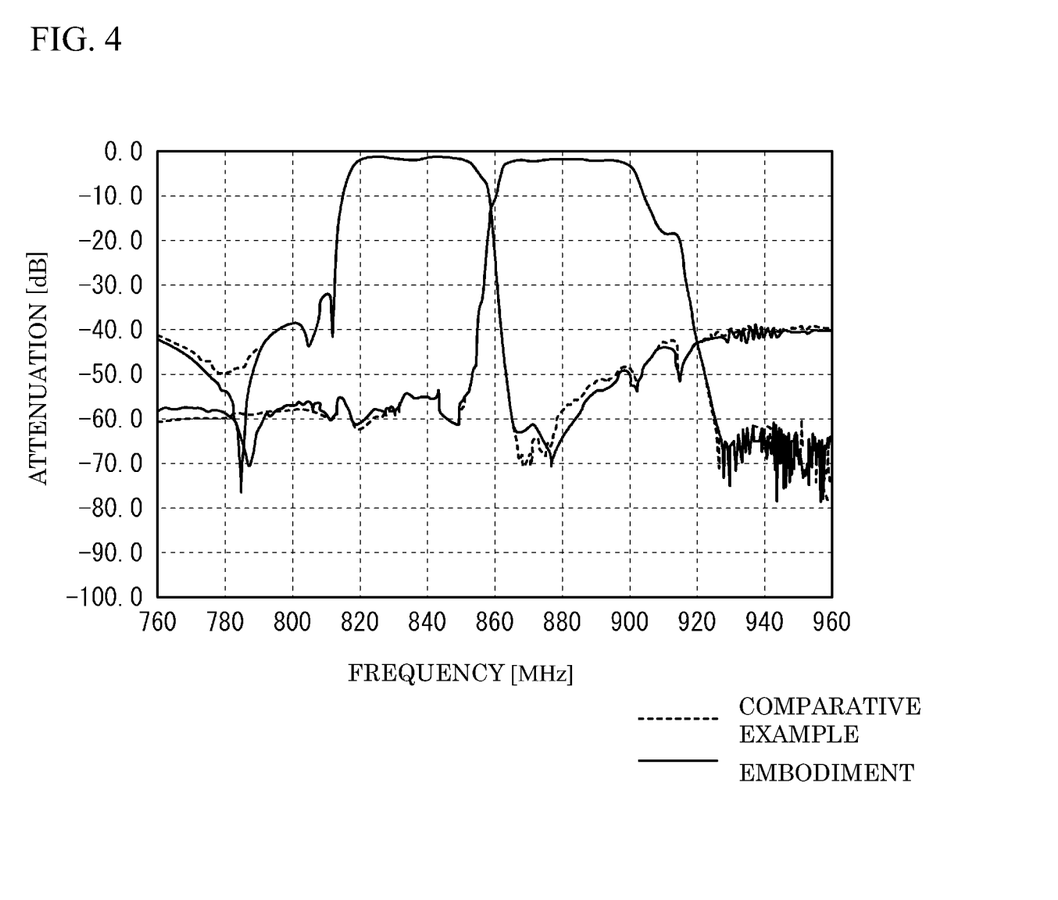
FIG. 4 is a graph illustrating filter characteristics of the duplexers of the first embodiment and comparative example.
Figure 5:
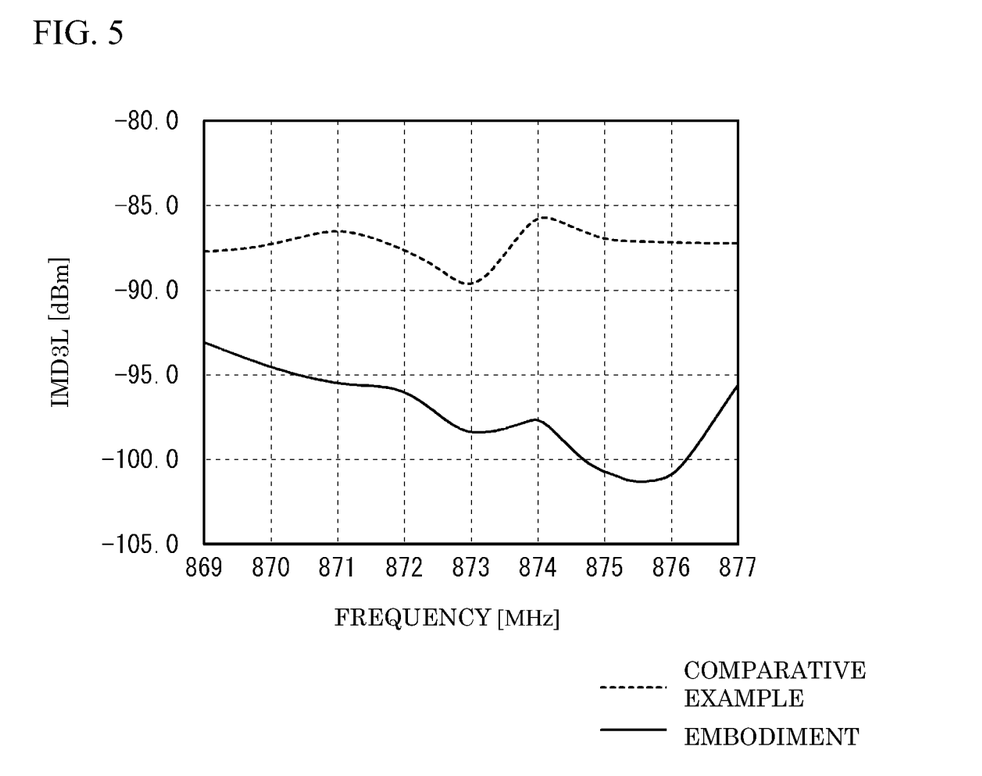
FIG. 5 is a graph illustrating IMD suppression characteristics of the duplexers of the first embodiment and comparative example.

FIG. 4 is a graph illustrating filter characteristics of the duplexers of the first embodiment and the comparative example, and FIG. 5 is a graph illustrating IMD suppression characteristics of them in the reception filter 14. As illustrated in FIG. 4, in the passband (Tx, Rx), both filter characteristics (insertion loss and bandwidth) are almost the same. As illustrated in FIG. 5, however, in the frequency band of intermodulation distortion (IMD), the first embodiment has better suppression characteristics than the comparative example.

Figure 6:
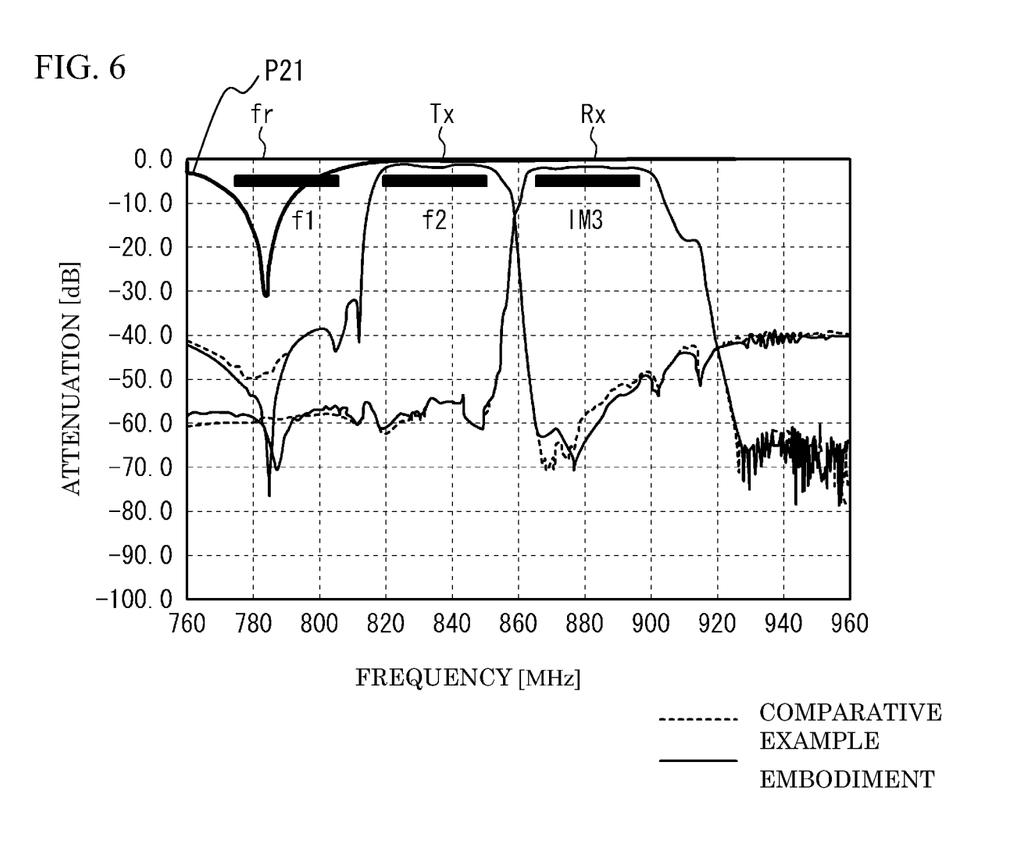
FIG. 6 is a graph illustrating wide-band filter characteristics of the duplexers of the first embodiment and comparative example.

FIG. 6 is a graph illustrating wide-band filter characteristics of the duplexers of the first embodiment and the comparative example. In the graph, f1 represents an interference frequency, f2 represents a transmission frequency, and IM3 represents an intermodulation distortion frequency. In addition, P21 is a line indicating the resonance characteristic of the parallel resonator P21.

The duplexer of the first embodiment can reduce intermodulation distortion by arranging the parallel resonator P21 between the antenna terminal Ant and a ground in the reception filter 14. At this time, the concentration of interfering waves on one electrode can be prevented by configuring the parallel resonator P21 to be the divided resonator (P21a through P21c), and thus only intermodulation distortion can be reduced without degrading filter characteristics.

The first embodiment configures adjoining electrode fingers located in the adjoining IDTs out of the IDTs forming the resonators P21a through P21c formed by division to face in the same direction. Hereinafter, a detailed description will be given of this point.

Figure 7A:
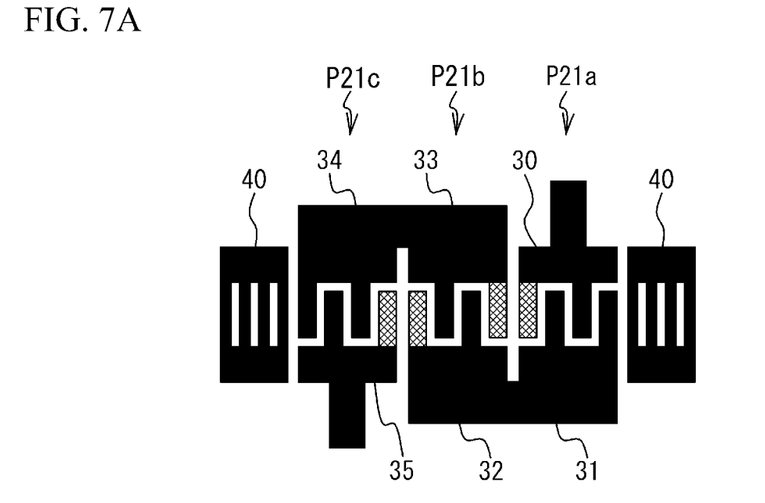
FIG. 7A and FIG. 7B are diagrams illustrating configurations of divided resonators in accordance with the first embodiment and first variation thereof.
Figure 7B:
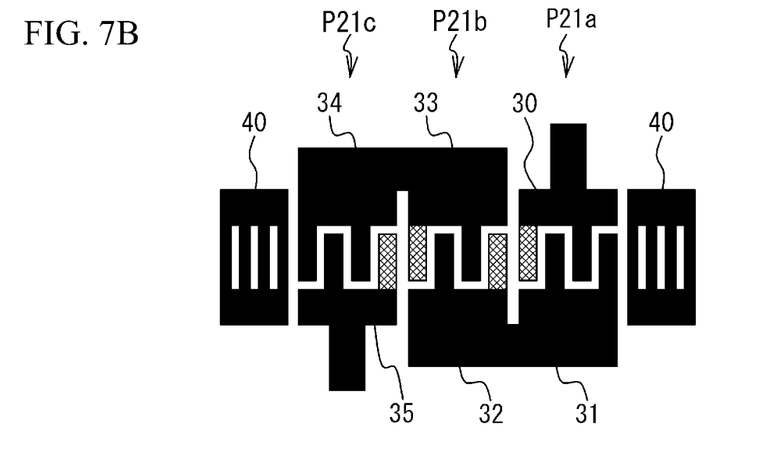

FIG. 7A and FIG. 7B are diagrams illustrating configurations of divided resonators of the first embodiment and a variation thereof. FIG. 7A presents the first embodiment, and FIG. 7B presents a first variation thereof. As illustrated in FIG. 7A and FIG. 7B, the resonators P21a through P21c formed by division include a pair of IDTs 30 through 35 and two reflection electrodes 40 located at both ends thereof, respectively. The IDTs 31 and 32 are connected to each other in the base to be unified, and the IDTs 33 and 34 are connected to each other in the base to be unified.

As illustrated in FIG. 7A, in the first embodiment, adjoining electrode fingers (illustrated by hatching) located in the adjoining IDTs (IDTs 30 and 33, IDTs 32 and 35) face in the same direction. In contrast, as illustrated in FIG. 7B, in the first variation, adjoining electrode fingers (illustrated by hatching) located in the adjoining IDTs (IDTs 30 and 32, IDTs 33 and 35) face in different (opposite) directions.

Figure 8A:
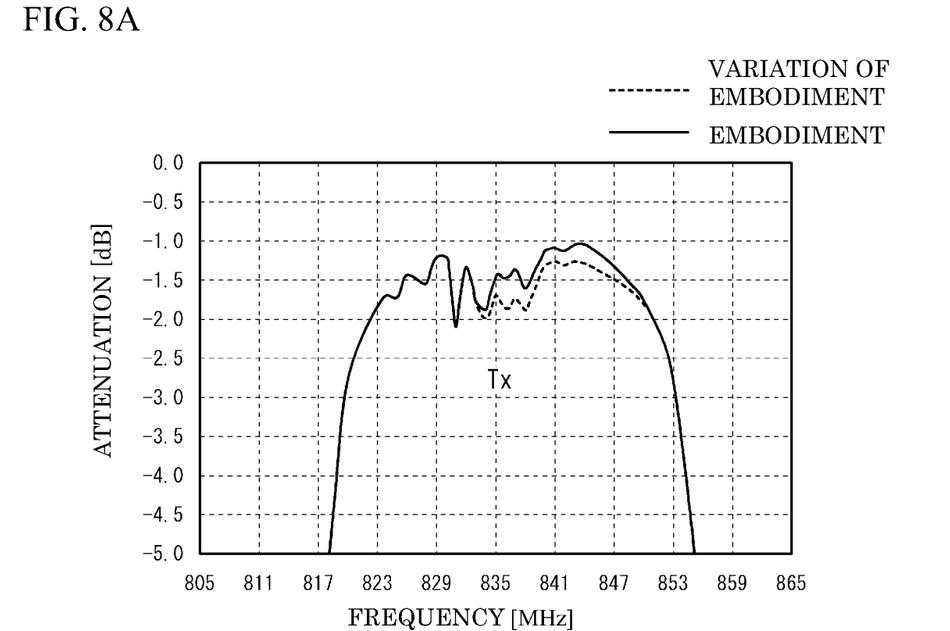
FIG. 8A and FIG. 8B are graphs illustrating filter characteristics of the duplexers of the first embodiment and first variation thereof.
Figure 8B:
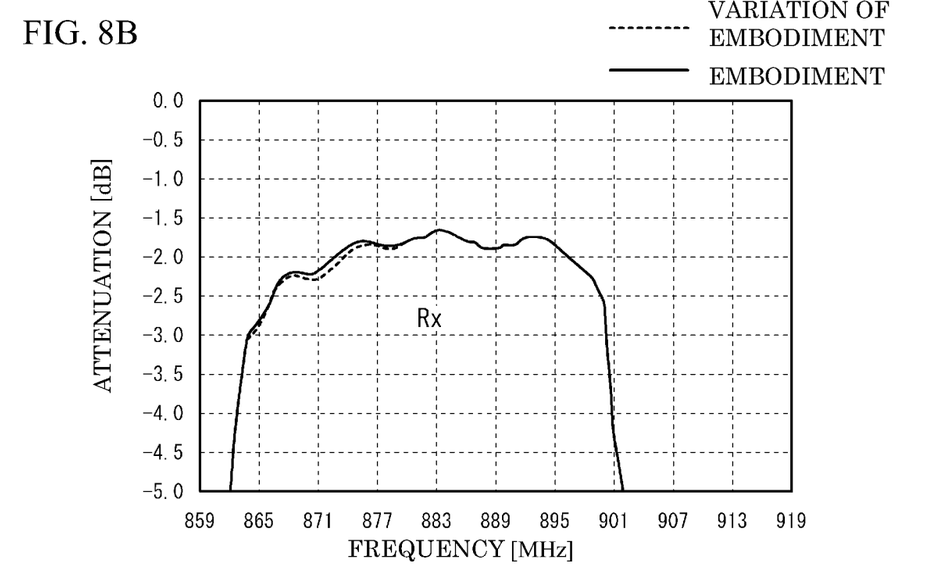

FIGS. 8A and 8B are graphs illustrating filter characteristics of the duplexers in accordance with the first embodiment and the first variation thereof. FIG. 8A illustrates filter characteristics around the passband of the transmission filter 12, and FIG. 8B illustrates filter characteristics around the passband of the reception filter 14. As illustrated in FIG. 8A and FIG. 8B, the first embodiment reduces insertion loss more than the first variation in both the transmission filter 12 and the reception filter 14. Therefore, in the resonators P21a through P21c formed by division, the adjoining electrode fingers located in the adjoining IDTs are preferably configured to face in the same direction.

The first embodiment divides the parallel resonator P21 of the reception filter 14 into three, but may divide into other numbers.

Figure 9:
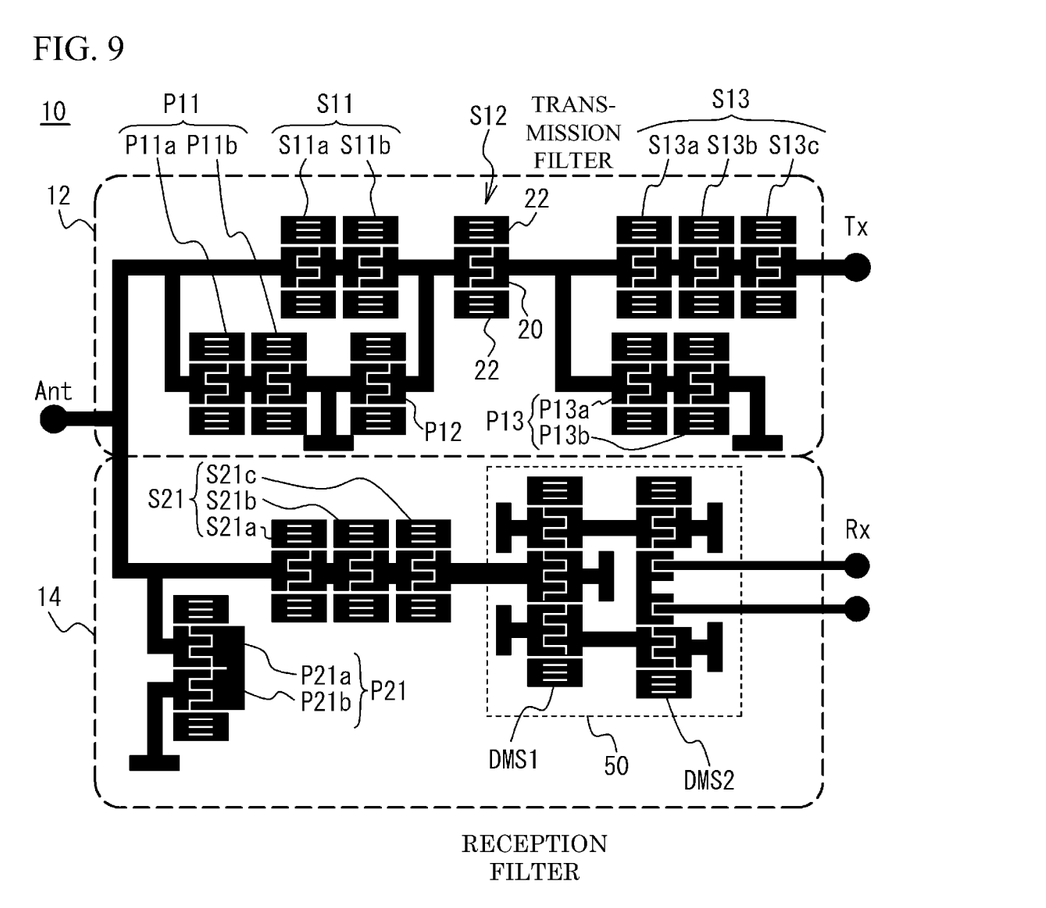
FIG. 9 is a diagram illustrating a duplexer in accordance with a second variation of the first embodiment.

FIG. 9 is a diagram illustrating a configuration of a duplexer in accordance with a second variation of the first embodiment. Unlike the first embodiment (FIG. 1), the parallel resonator P21 is divided into two. Other configuration is the same as that of the first embodiment. The present configuration also enables to reduce only intermodulation distortion without degrading filter characteristics by configuring the parallel resonator P21 to be the divided resonator as with the first embodiment. The parallel resonator P21 may be divided into four or more.

Second Embodiment

A second embodiment changes a divided direction of the divided resonator.

Figure 10:
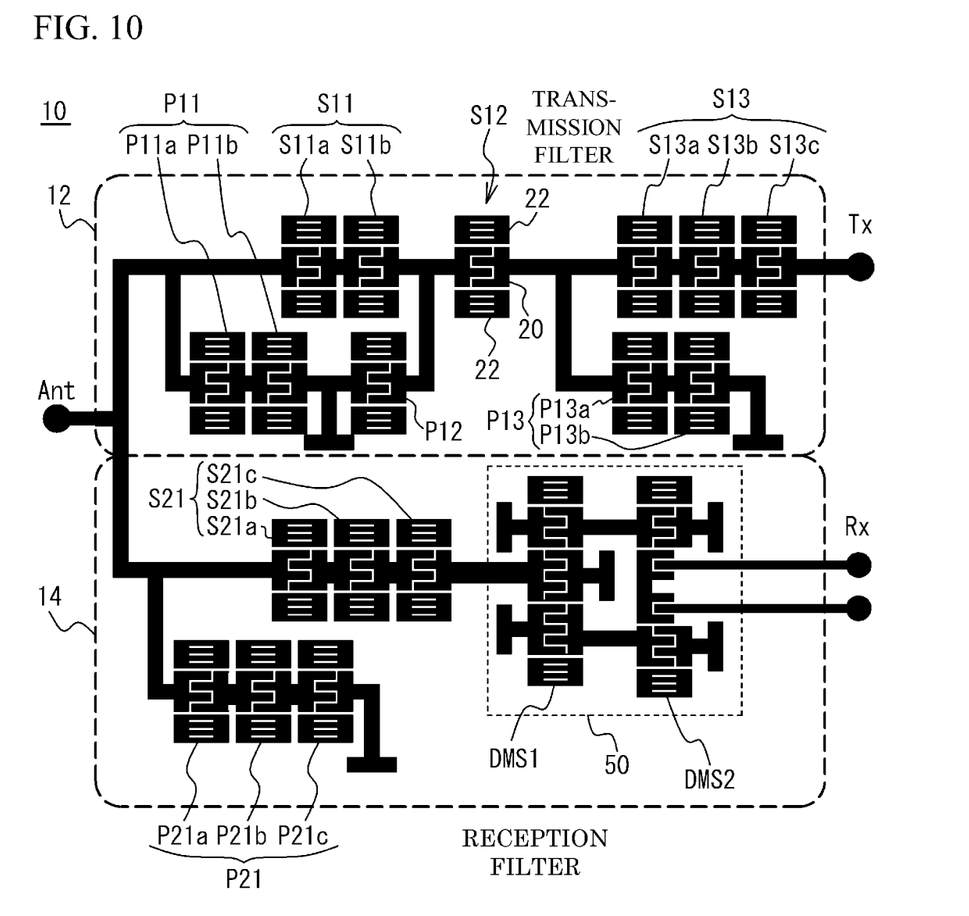
FIG. 10 is a diagram illustrating a configuration of a duplexer in accordance with a second embodiment.

FIG. 10 is a diagram illustrating a configuration of a duplexer in accordance with the second embodiment. In the reception filter 14, a divided direction of the parallel resonator P21 is different from that of the first embodiment (FIG. 1). Other configuration is the same as that of the first embodiment, and a detailed description is omitted.

The second embodiment divides the parallel resonator P21 in a direction intersecting with the propagation direction of a surface acoustic wave (SAW) (e.g. the perpendicular direction to the propagation direction) to form three parallel resonators P21a through P21c. The present configuration also enables to reduce only intermodulation distortion without degrading filter characteristics by configuring the parallel resonator P21 to be the divided resonator in the same manner as the first embodiment. However, the dividing method of the first embodiment makes three resonators (P21a through P21c) formed by division share the reflection electrodes at both ends, and thus enables to downsize the device.

Third Embodiment

A third embodiment variously changes a configuration of the reception filter. A difference from the first embodiment (FIG. 1) will be mainly described in a description for each drawing. FIG. 11 through FIG. 14 have a common configuration in which the reception filter 14 of a duplexer in accordance with the third embodiment does not include the series resonator S21.

Figure 11:
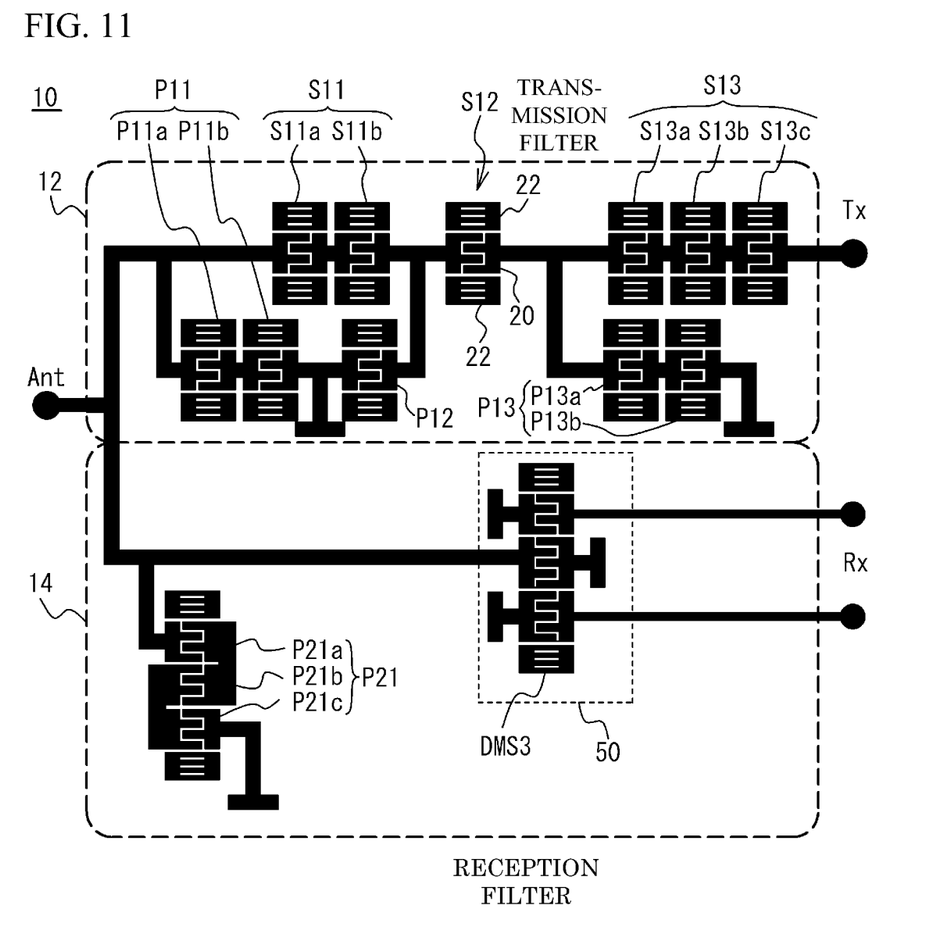
FIG. 11 is a diagram illustrating a first configuration of a duplexer in accordance with a third embodiment.

FIG. 11 is a diagram illustrating a first configuration of the duplexer in accordance with the third embodiment. The DMS unit 50 in FIG. 1 employs a configuration in which the DMS1 and DMS2 are connected in series (cascade-connected), but a DMS3 is provided independently in FIG. 11. The DMS3 includes three IDTs arranged in the propagation direction of a surface acoustic wave and reflection electrodes located at both ends thereof. The IDT located at the center out of the three IDTs is coupled to the antenna terminal Ant, and other IDTs are coupled to balanced output terminals of the reception terminal Rx.

Figure 12:
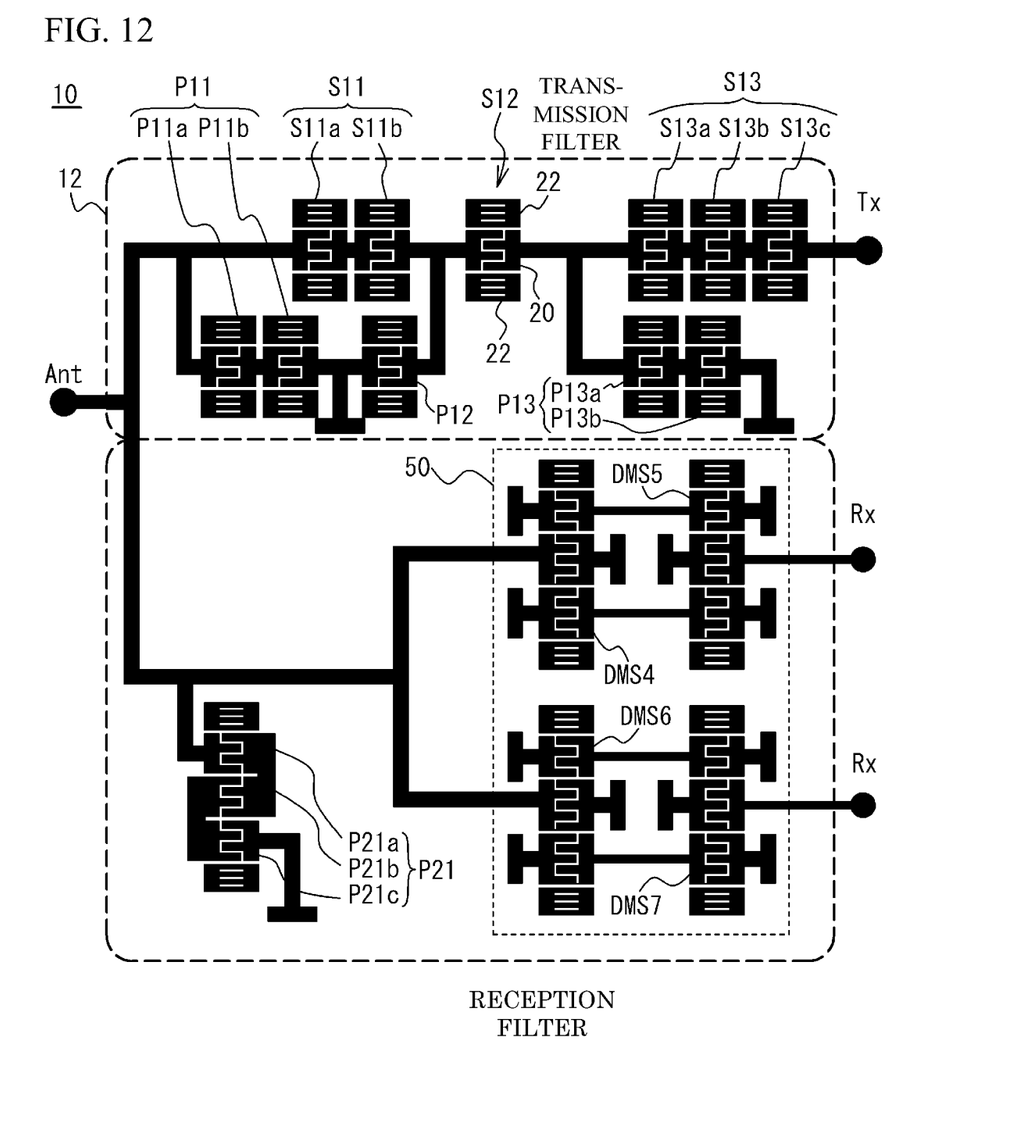
FIG. 12 is a diagram illustrating a second configuration of the duplexer of the third embodiment.

FIG. 12 is a diagram illustrating a second configuration of the duplexer in accordance with the third embodiment. A waveguide is separated into two before the DMS unit 50, and one of them is coupled to a DMS4 and a DMS5 connected in series, and the other is coupled to a DMS6 and a DMS7 connected in series. The DMS4 through DMS7 have a configuration in which three IDTs are arranged in the propagation direction of a surface acoustic wave. The IDTs located at the center in the DMS4 and DMS6 are coupled to the antenna terminal Ant, and the IDTs located at the center in the DMS5 and DMS7 are coupled to the balanced output terminals of the reception terminals Rx. The IDTs at both ends of the DMS4 and DMS5 are coupled to each other, and the IDTs at both ends of the DMS6 and DMS7 are coupled to each other.

Figure 13:
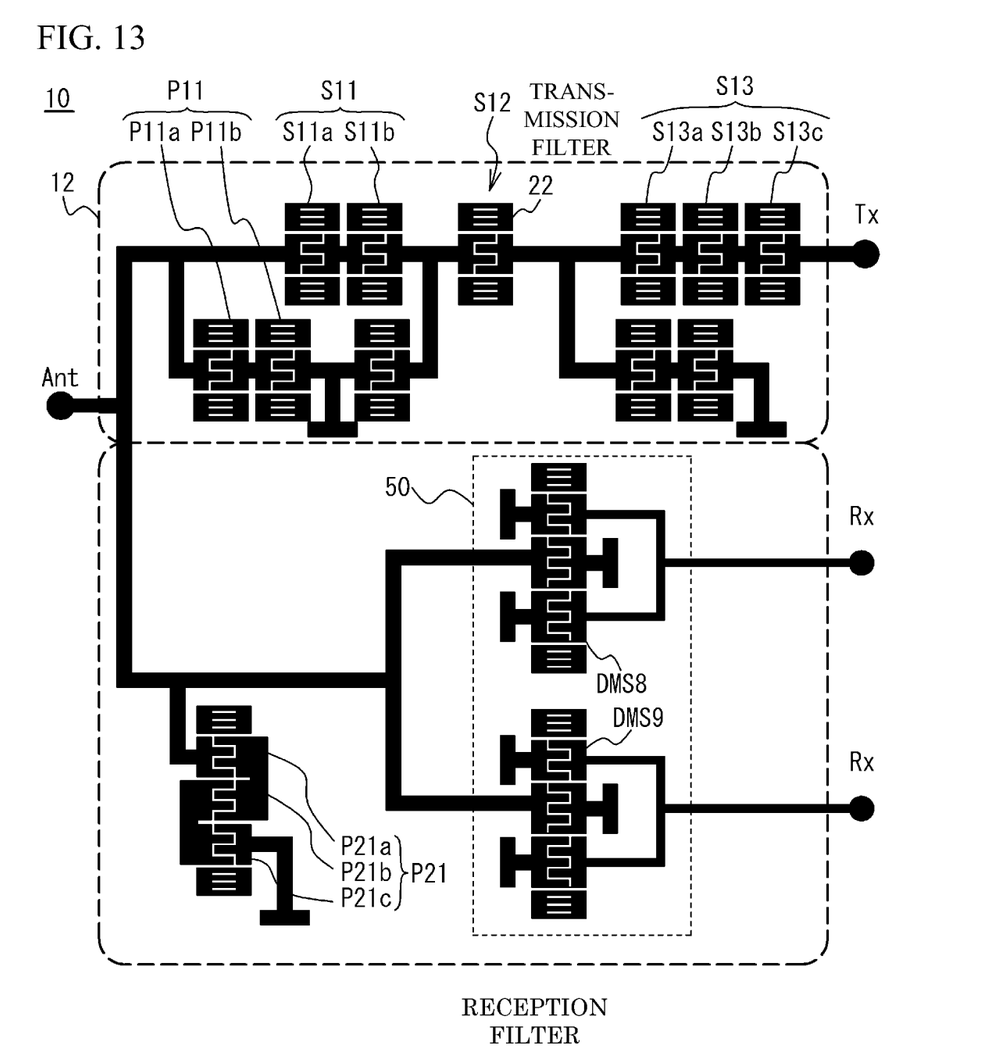
FIG. 13 is a diagram illustrating a third configuration of the duplexer of the third embodiment.

FIG. 13 is a diagram illustrating a third configuration of the duplexer of the third embodiment. The waveguide is separated into two before the DMS unit 50, and one of them is coupled to a DMS8, and the other is coupled to a DMS9. The DMS8 and DMS9 have a configuration in which three IDTs are arranged in the propagation direction of a surface acoustic wave. The IDTs located at the center in the DMS8 and DMS9 are coupled to the antenna terminal Ant, and other IDTs are coupled to the balanced output terminals of the reception terminals Rx.

Figure 14:
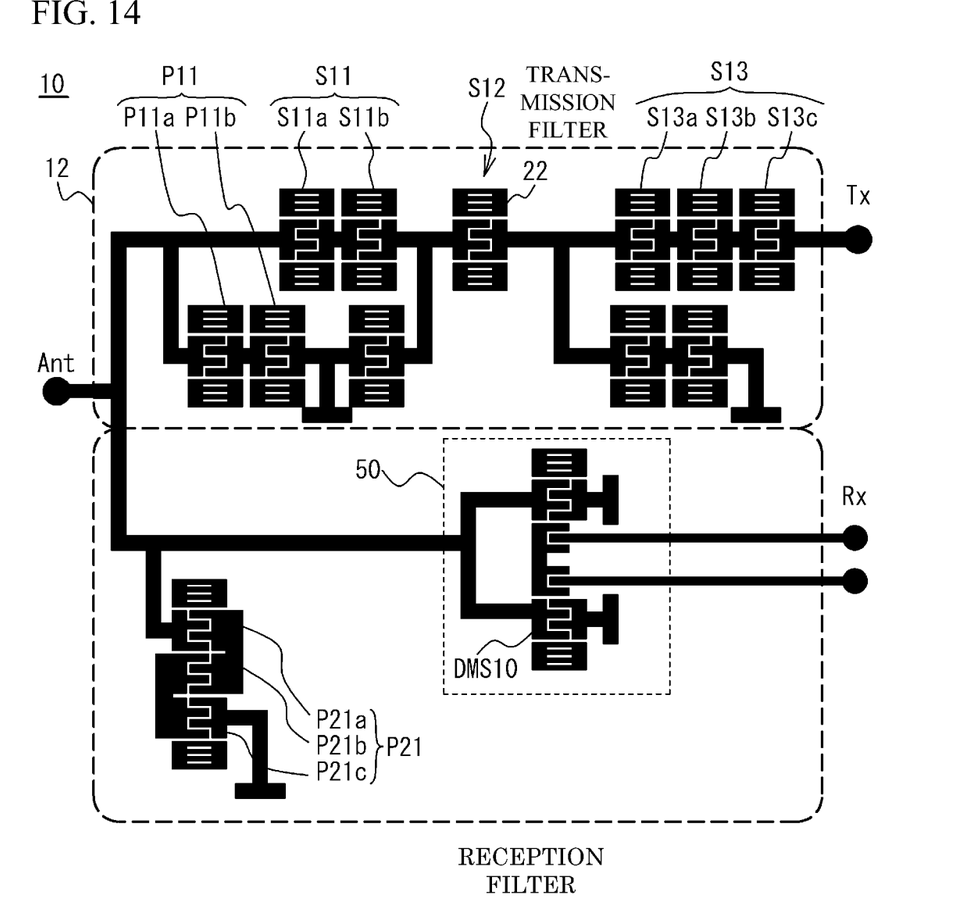
FIG. 14 is a diagram illustrating a fourth configuration of the duplexer of the third embodiment.

FIG. 14 is a diagram illustrating a fourth configuration of the duplexer in accordance with the third embodiment. The DMS unit 50 includes a DMS10 in which four IDTs are arranged in the propagation direction of a surface acoustic wave. The waveguide is separated into two before the DMS unit 50, and coupled to IDTs located at both ends out of the four IDTs. The two IDTs located at the center in the DMS10 are coupled to the balanced output terminal of the reception terminal Rx. The two IDTs located at the center in the DMS10 are connected to each other in the base and unified.

As described above, the duplexers of the third embodiment (FIG. 11 through FIG. 14) can also reduce only intermodulation distortion without degrading filter characteristics by configuring the parallel resonator P21 closest to the antenna terminal Ant to be the divided resonator as with the first embodiment. The parallel resonator P21 may be divided in a direction different from the propagation direction of a surface acoustic wave as described in the second embodiment. The division number of the parallel resonator P21 may be an arbitrary number as long as it is two or more. When the reception filter 14 of the third embodiment is formed by a ladder-type filter, the output of the DMS may be configured to be an unbalanced output.

As described above, the duplexers in accordance with the first through third embodiments include resonators, and at least one of the resonators is connected to a ground. A resonator located at a side closest to a common terminal (antenna terminal) out of the resonator connected to a ground is the divided resonator divided into two or more. That is to say, "at the side closest to" means a parallel arm closest to the common terminal among the parallel arms of the ladder-type filter, and means, when only one parallel arm is provided, the one parallel arm. Therefore, the above described configuration of the duplexer includes a configuration in which a resonator (series resonator) not connected to a ground is located at a side closer to the common terminal than the divided resonator connected to a ground (serial arm between the divided resonator and the common terminal). However, to prevent the concentration of interfering waves, the divided resonator connected to a ground is preferably located at the side closest to the antenna terminal among all resonators including a series resonator.

The first through third embodiments describe a case where the parallel resonator P21 is serially divided, but the parallel resonator P21 may be divided in parallel. That is to say, one of the two parallel resonators P21a and P21b is coupled to the antenna terminal Ant, and the other is connected to a ground independently. In this case, the concentration of interfering waves on one electrode can be prevented, and thus the intermodulation distortion can be reduced without degrading filter characteristics.

In addition, the first through third embodiments use an acoustic wave device using a surface acoustic wave (SAW) as an acoustic wave device forming a resonator and DMS, but may employ an acoustic wave device using a Love wave, a boundary acoustic wave, or the like as an acoustic wave device in which an IDT is formed on a piezoelectric substrate. The piezoelectric substrate may be a lithium niobate ($LiNbO_3$) substrate or lithium tantalate ($LiTaO_3$) substrate, for example. A metal used to form a wiring pattern (part filled with black in FIG. 1, FIG. 3, FIG. 9 through FIG. 14) such as an IDT may be aluminum (Al) or copper (Cu), for example.

Although the embodiments of the present invention have been described in detail, it is to be understood that the various change, substitutions, and alterations could be made hereto without departing from the spirit and scope of the invention.

What is claimed is:

1. A duplexer comprising:
    a transmission filter connected between a common terminal and a transmission terminal; and
    a reception filter connected between the common terminal and a reception terminal, wherein
    the reception filter includes resonators located on a piezoelectric substrate,
    at least one resonator of the resonators is connected in parallel between the common terminal and the reception terminal and connected to a ground, and a resonator located at a side closest to the common terminal out of the at least one resonator of the resonators is divided into two or more divided resonators, and
    a resonance frequency fr of the divided resonators is in a range of fr=2×($f_{TL}$ to $f_{TH}$)−($f_{RL}$ to $f_{RH}$) when a pass band of the transmission filter is $f_{TL}$ to $f_{TH}$ and a pass band of the reception filter is $f_{RL}$ to $f_{RH}$.

2. The duplexer according to claim 1, wherein
    the divided resonators are serially connected between a node, which is located between the common terminal and the reception terminal, and the ground.

3. The duplexer according to claim 2, wherein
    the divided resonators are arranged in a propagation direction of an acoustic wave.

4. The duplexer according to claim 3, wherein
    the divided resonators include pairs of IDTs (Interdigital Transducer) arranged in the propagation direction of the acoustic wave, each of adjoining electrode fingers is located in each of adjoining IDTs out of the pairs of IDTs, adjoining electrode fingers extend in a same direction.

5. The duplexer according to claim 2, wherein the divided resonators are arranged in a direction intersecting with a propagation direction of an acoustic wave.

6. The duplexer according to claim 1, wherein each of the divided resonators is a surface acoustic wave resonator, a boundary acoustic wave resonator, or a Love wave resonator.

7. The duplexer according to claim 1, wherein a resonator located at a side closest to the common terminal out of the resonators is connected in parallel between the common terminal and the reception terminal.

* * * * *